(12) United States Patent
Hwang

(10) Patent No.: US 7,759,865 B2
(45) Date of Patent: Jul. 20, 2010

(54) PLASMA DISPLAY PANEL INCLUDING A CHASSIS BASE WITH A REINFORCING MEMBER

(75) Inventor: Hui-Yun Hwang, Yongin-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 546 days.

(21) Appl. No.: 11/713,612

(22) Filed: Mar. 5, 2007

(65) Prior Publication Data
US 2008/0088533 A1 Apr. 17, 2008

(30) Foreign Application Priority Data
Oct. 13, 2006 (KR) ...................... 10-2006-0099780

(51) Int. Cl.
*H01J 17/49* (2006.01)
(52) U.S. Cl. ...................... 313/582; 313/587
(58) Field of Classification Search .......... 313/582–587
See application file for complete search history.

(56) References Cited

U.S. PATENT DOCUMENTS

| | | | |
|---|---|---|---|
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Shinoda et al. | |
| 5,724,054 A | 3/1998 | Shinoda | |
| 5,786,794 A | 7/1998 | Kishi et al. | |
| 5,952,782 A | 9/1999 | Nanto | |
| RE37,444 E | 11/2001 | Kanazawa | |
| 6,630,916 B1 | 10/2003 | Shinoda | |
| 6,707,436 B2 | 3/2004 | Setoguchi et al. | |
| 2006/0077620 A1 | 4/2006 | Kim | |

FOREIGN PATENT DOCUMENTS

| | | |
|---|---|---|
| CN | 200510108168 A | 4/2006 |
| JP | 2845183 | 10/1998 |
| JP | 2917279 | 4/1999 |
| JP | 2001-043804 | 2/2001 |
| JP | 2001-325888 | 11/2001 |
| KR | 10-2006-0041485 | 5/2006 |
| KR | 10-2006-0084592 | 7/2006 |

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms and Discharge Characteristics; Annex C—Gaps and Annex D—Manufacturing.

*Primary Examiner*—Bumsuk Won
(74) *Attorney, Agent, or Firm*—Robert E. Bushnell, Esq.

(57) ABSTRACT

A Plasma Display Panel (PDP) that prevents an increase in manufacturing cost due to an addition of a reinforcing material includes: a display panel; a driving circuit to supply a driving signal to the display panel; and a chassis base, disposed between the driving circuit and the display panel, and including a reinforcing member having at least one bend and arranged on at least one side of edges of the chassis base.

10 Claims, 4 Drawing Sheets

PLASMA DISPLAY PANEL INCLUDING A CHASSIS BASE WITH A REINFORCING MEMBER

CLAIM OF PRIORITY

This application makes reference to, incorporates the same herein, and claims all benefits accruing under 35 U.S.C. §119 from an application for PLASMA DISPLAY PANEL earlier filed in the Korean Intellectual Property Office on 13 Oct. 2006 and there duly assigned Serial No. 10-2006-0099780.

BACKGROUND OF THE INVENTION

1. Field of the Invention

The present invention relates to a Plasma Display Panel (PDP) and, more particularly, to a PDP that prevents an increase in manufacturing cost due to an addition of a reinforcing material.

2. Description of the Related Art

Recently, flat panel display devices have attracted attention as image display devices replacing conventional television sets using Cathode Ray Tubes (CRTs). Such flat panel display devices include Liquid Crystal Displays (LCDs) that have succeeded in commercialization, Plasma Display Panels (PDPs) and electroluminescent devices (ELDs). Moreover, research aimed at developing Field Emission Displays (FEDs) and vacuum fluorescent displays have continued to progress actively.

Among them, PDPs are display devices using light emission by an electrical discharge that may be readily fabricated in a large size and capable of processing digital images. Accordingly, PDPs have been widely used along with Liquid Crystal Displays (LCDs).

A PDP includes a display panel in which discharge cells are established, a chassis base supporting the display panel, and a driving circuit attached to the chassis base and connected to the display panel through a Flexible Flat Cable (FFC).

The chassis base has various uses such as a common ground of the driving circuit and the like along with the mechanical function of supporting the display panel and the driving circuit. Moreover, the chassis base performs an important role in radiating heat generated in the display panel and the driving circuit. Such a chassis base is fabricated lightly and strongly using aluminum or an alloy thereof. To this end, it is possible to reduce the manufacturing cost of the PDP only with a change in the chassis base structure or with a reduction in the materials needed for the chassis base. To making the most of these advantages, the conventional PDP has used the chassis base wherein the thickness thereof is minimized except for a portion required for maintaining its strength and a reinforcing material is adopted to reinforce a portion on which a physical force is concentrated. Moreover, using a conductive material corresponding to the chassis base as the reinforcing material added to the chassis base makes it possible to ensure a stable common ground and utilize the chassis base as means for radiating heat as well.

The chassis base and the reinforcing material are also used as means for radiating heat in the FFC as well as in the display panel. A portion of driving units in the PDP, i.e., an address driving unit, connects the driving circuit to the display panel with a Tape Carrier Package (TCP). A driving chip is mounted in the TCP connecting the address driving unit to the display panel. Since signals of a high voltage supplied to the display panel are continuously supplied to the driving chip, the driving chip generates heat more than the other elements and is thereby frequently damaged. On this account, the heat radiation is supported using a separate heat radiating member, such as a reinforcing material or a heat sink, in the conventional art.

However, the reinforcing material added to the chassis base has some drawbacks in that it must be manufactured by a separate manufacturing process and a process for adding the reinforcing material thereto is needed, which is of no help to the reduction of manufacturing cost, but rather increases the manufacturing cost. Moreover, there exists an inconvenience in that a separate means for connecting the reinforcing member is further required.

SUMMARY OF THE INVENTION

Accordingly, the present invention has been contrived to solve the problems described above and, an object of the present invention is to provide a Plasma Display Panel (PDP) that prevents an increase in manufacturing cost due to an addition of a reinforcing material.

Another object of the present invention is to provide a PDP that supports the heat radiation of a TCP in place of the reinforcing material.

To accomplish above object of the present invention, a Plasma Display Panel (PDP) is provided including: a display panel; a driving circuit to supply a driving signal to the display panel; and a chassis base, arranged between the driving circuit and the display panel, and including a reinforcing member having at least one bend and arranged on at least one side of edges of the chassis base.

The reinforcing member preferably includes: a first flat extending from a surface of the chassis base in a direction perpendicular thereto; a second flat spaced apart from the first flat on the chassis base surface in a direction perpendicular to the chassis base surface; and a connecting portion to connect the first flat to the second flat.

The reinforcing member preferably further includes a third flat extending from the second flat on the chassis base surface in a direction parallel to the chassis base surface. The reinforcing member preferably further includes a filling layer arranged between the first flat and the second flat. The reinforcing member preferably further includes a filling layer arranged between the first flat and the second flat and a filling layer arranged between the third flat and the chassis base surface. The filling layer is preferably at least one of graphite, aluminum, copper, or a thin plate or tape made of an alloy thereof, and a heat conductive silicon gel.

The driving circuit unit and the display panel are preferably electrically connected together by a conductive connecting member including a Tape Carrier Package (TCP) having a driving chip arranged thereon.

The driving chip is preferably arranged to contact the first flat.

The PDP preferably further includes at least one of a heat conductor and an adhesion layer arranged between the driving chip and the first flat.

The PDP preferably further includes a protection plate arranged on the reinforcing member of the chassis base and spaced apart from the connecting member. The connecting member is arranged to contact the driving chip.

The PDP preferably further includes at least one of a heat conductor and an adhesion layer arranged between the connecting member and the driving chip.

The PDP preferably further includes an edge portion extending from at least one side of the edges of the chassis base having no reinforcing member arranged thereon in a direction perpendicular to the chassis base surface.

The PDP preferably further includes at least one of an adhesion member and a heat conducting member arranged between the chassis base and the display panel.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
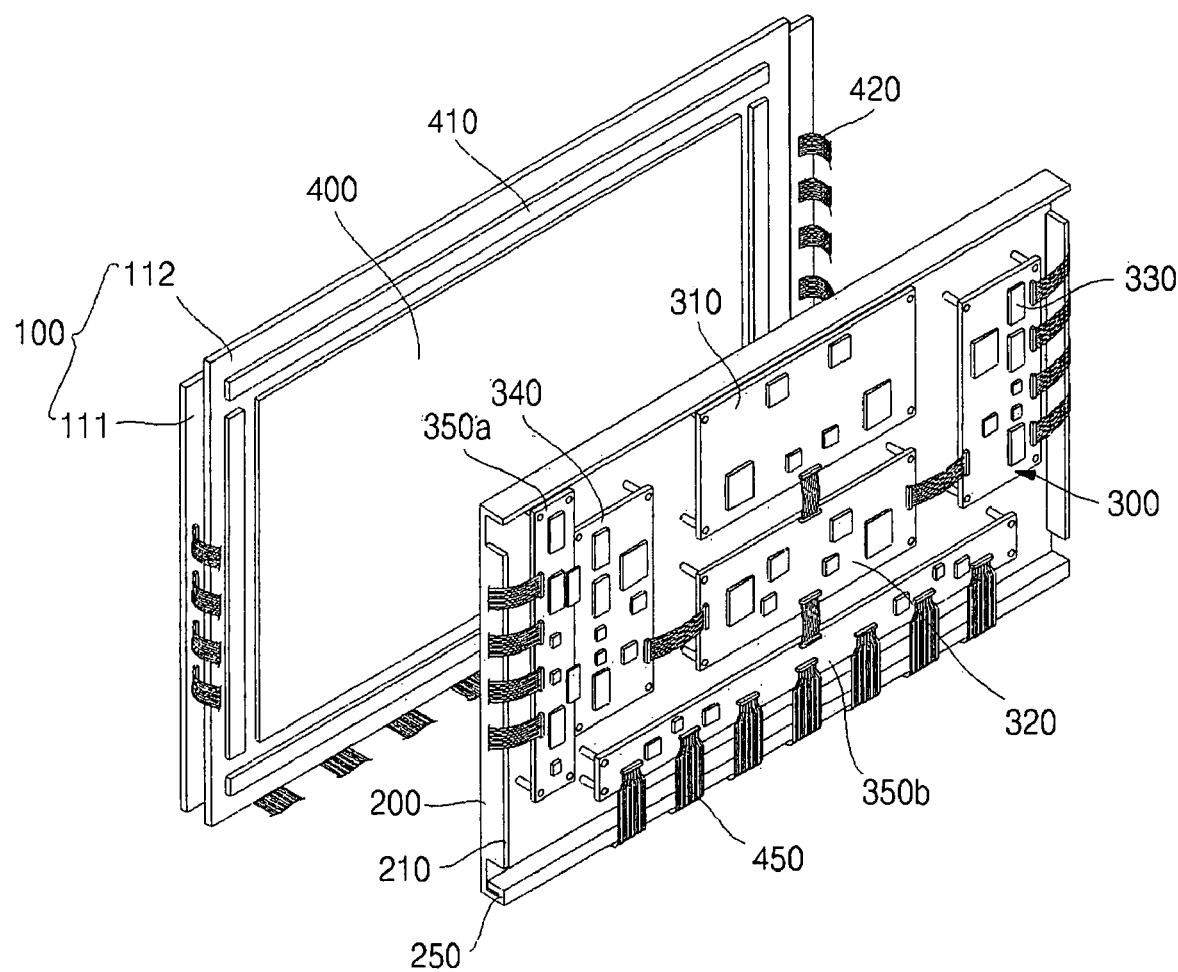
FIG. 1 is an exploded perspective view of a PDP in accordance with an embodiment of the present invention.

A detailed description follows with reference to the accompanying drawings to explain the exemplary embodiments of the present invention. However, the description does not show all of the forms to which the present invention is embodied. This invention can be embodied in many different forms and should not be construed as being limited to the embodiments set forth herein. Rather, these embodiments are provided so that this disclosure will be thorough and complete, and will fully convey the scope of the present invention to those having ordinary skill in the art.

Some features depicted in the drawings have been enlarged for convenience's sake and the drawings and the elements may not be depicted in an appropriate ratio. However, those having ordinary skill in the art will readily appreciate these and other details.

FIG. 1 is an exploded perspective view of a PDP in accordance with an embodiment of the present invention.

Referring to FIG. 1, the PDP in accordance with the present invention includes a display panel 100, a chassis base 200, and a driving circuit unit 300.

The display panel 100 includes a front substrate 111 and a rear substrate 112. Discharge cells configured by a barrier rib, a dielectric layer, a phosphor layer, electrodes and a protective layer are established between the front substrate 111 and the rear substrate 112. Moreover, an inert gas is encapsulated therebetween. The display panel 100 supplies a driving signal from the driving circuit unit 300 to the discharge cells and an image is displayed in the discharge cells by the electrical discharge generated by the driving signal. The rear substrate 112 of the display panel 100 is attached to the front surface of the chassis base 200 to be fixed and supported.

The chassis base 200 fixes and supports the display panel 100 and further aids the radiation of heat generated by the display panel 100. Moreover, the chassis base 200 fixes and supports the driving circuit unit 300 through another surface not attached to the display panel 100. Furthermore, the chassis base 200 may be used as a common ground of the driving circuit unit 300 and can therefore be electrically coupled to the driving circuit unit 300. A reinforcing member 250 is established on one edge side of the chassis base 200. The reinforcing member 250 reinforces the strength of the chassis base 200 and further supports the radiation of heat transmitted by a driving chip mounted in a Tape Carrier Package (TCP) 450 of connecting members 420 and 450 connecting the display panel 100 to the driving circuit unit 300. To this end, the reinforcing member 250 is fabricated integrally with the chassis base 200 and has a multi-faced structure which extends and is bent at least at a bending portion. A detailed description of the reinforcing member 250 follows with reference to FIG. 2 henceforth. Furthermore, an edge portion 210 for the reinforcement may be arranged on the other edge side of the chassis base 200.

The driving circuit unit 300 supplies a driving signal to the display panel 100 and is connected to the display panel 100 by the connecting members 420 and 450. To this end, the driving circuit unit 300 includes an image processor, a power supply, a logic controller, an address driver, a scan driver, a sustain driver and a buffer board. The respective drivers are mounted on the respective printed circuit boards by their functions, but the present invention is not limited thereto. That is, they may be divided into a power supply substrate 310, a logic control substrate 320, a scan driving substrate 340, a sustain driving substrate 330 and buffer board substrates 350 (350a and 350b). Moreover, one driving circuit unit 300 may be divided into at least two substrates or at least two driving units may be arranged on one substrate. Furthermore, the buffer board 350 may be arranged additionally on a portion of the respective substrates 310, 320, 330 and 340.

Flexible Flat Cables (FFC) are used as the connecting members 420 and 450. A mounting type driver chip, such as the TCP described above, may also be used, but the present invention is not limited thereto. The TCP connecting member 450 comes in contact with the reinforcing member 250 so that the heat radiation of the driving chip may be supported by the reinforcing member 250.

An adhesion member 410 and a heat conducting member 400 may be further disposed between the rear surface of the display panel 100, i.e., between the display panel 100 and the chassis base 200. An adhesion agent, an adhesion film or an equivalent material thereof may be used as the adhesion member 410 to fix the display panel 100 onto the chassis base 200. The heat conducting member 400 is disposed between the display panel 100 and the chassis base 200 so as to support the heat radiation of the display panel 100 or the heat transfer to the chassis base 200. The heat conducting member 400 minimizes a local temperature difference to prevent the display panel 100 from being damaged due to the local temperature difference. Moreover, the heat conducting member 400 and the adhesion member 410 may be made of materials having vibration absorbing properties so that the vibration from the display panel 100 or the chassis base 200 is not transmitted therebetween, but the present invention is not limited thereto.

Figure 2:
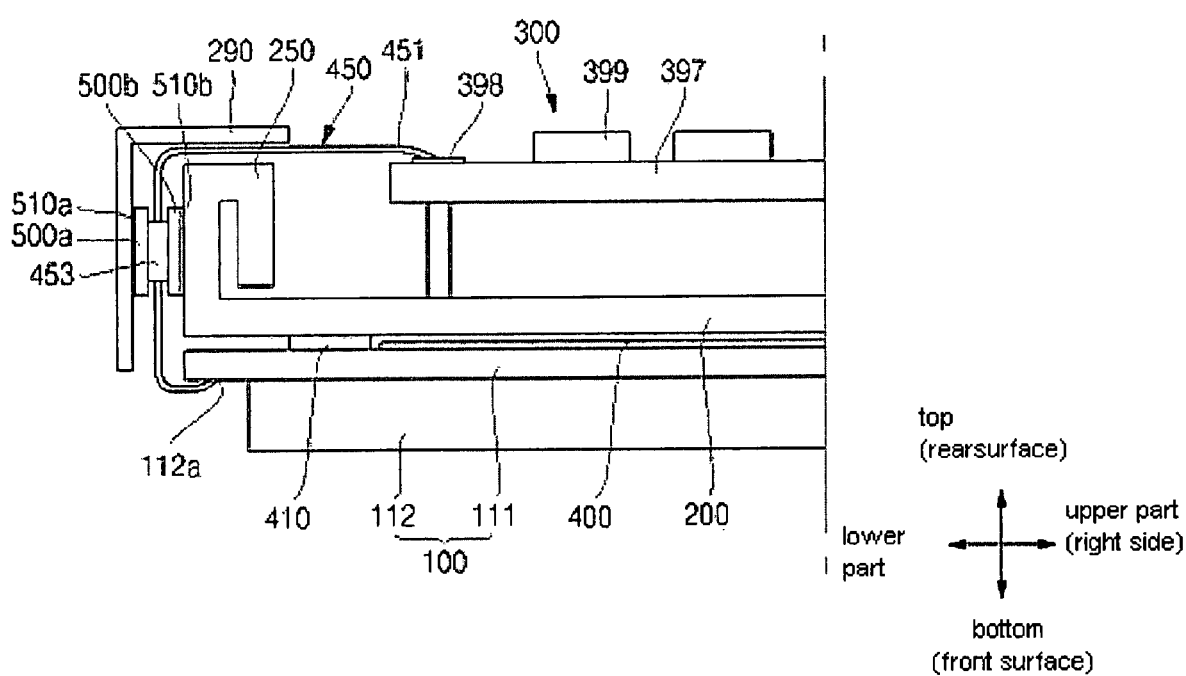
FIG. 2 is a cross-sectional view of a structure of a reinforcing member with a connecting member attached thereto.

FIG. 2 is a cross-sectional view of a structure of a reinforcing member with a connecting member attached thereto.

The cross-section of the chassis base 200 adjacent to the portion where the reinforcing member 250 is established is the same as that of FIG. 2. In FIG. 2, the display panel 100 is arranged below the chassis base 200. Moreover, as described above, the adhesion member 410 and the heat conducting member 400 may be disposed between the chassis base 200 and the display panel 100.

The display panel 100 is attached such a manner that the front substrate 111 and the rear substrate 112 are slightly stepped with respect to each other. The reason for this is to provide a space for electrically connecting to the connecting member depicted as the TCP connecting member 450 in FIG. 2, and the sizes of the front substrate 111 and the rear substrate 112 are formed differently from each other and joined together. That is, one end of the TCP connecting member 450 is attached to such a stepped portion 112a and the other end thereof is attached to a pad portion 398 of the driving circuit unit 300. The pad portion 398 may be electrically connected to patterns formed on a printed circuit board 397 of the driving circuit unit 300, and the respective patterns may be coupled to pixel elements 399. The driving chip 453 mounted on the TCP connecting member 450 is attached to the lower part of the chassis base 200. The driving chip 453 is attached to the lower part of the chassis base 200 because the right side of FIG. 2 becomes the top of the PDP when being used. Accordingly, the reinforcing member 250 is positioned above the driving chip 453 to facilitate the heat radiation.

A protection plate 290 may be attached to one side of the TCP connecting member 450. The protection plate 290 prevents the TCP connecting member 450 from being damaged and further supports the heat radiation of the driving chip 453. Moreover, heat conductors 500 (500a and 500b) and adhesion layers 510 (510a and 510b) may be further arranged between the protection plate 290 and the driving chip 453 and between the driving chip 453 and the reinforcing member 250. The heat conductor 500 and the adhesion layer 510 make the protection plate 290 and the driving chip 453 adhere closely to each other and also make the driving chip 453 and the reinforcing member 250 adhere closely to each other. Moreover, the heat conductor 500 and the adhesion layer 510 support the heat transfer from the driving chip 453 to improve the heat radiation efficiency. Although FIG. 2 depicts the heat conductor 500 and the adhesion layer 510 arranged both between the protection plate 290 and the driving chip 453 and also between the driving chip 453 and the reinforcing member 250, the heat conductor 500 and the adhesion layer 510 may be arranged on one of the sides thereof, but the present invention is not limited thereto.

Figure 3:
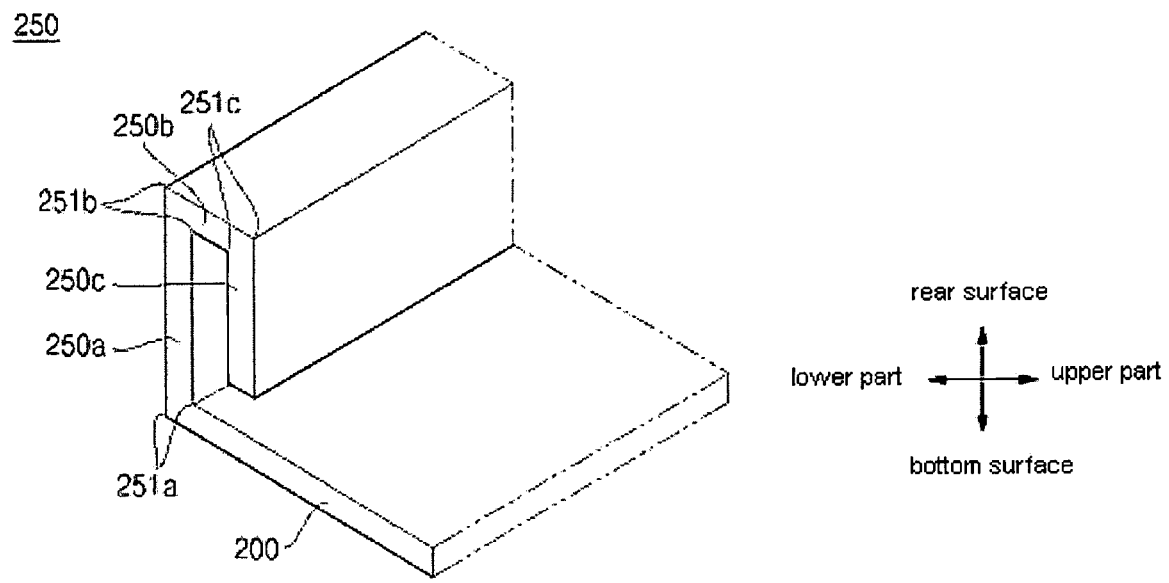
FIG. 3 is a partial perspective view of a structure of a reinforcing member in accordance with an embodiment of the present invention.

FIG. 3 is a partial perspective view of a structure of the reinforcing member.

Referring to FIG. 3, the reinforcing member 250 includes a first flat 250a extending from an edge side of the chassis base 200 in the rear surface direction, a second flat 250c spaced apart from the first flat 250a and parallel to the first flat 250a, and a connecting portion 250b connecting the first flat 250a to the second flat 250c and, at the same time, spacing the first flat 250a apart from the second flat 250c. It is desirable that the second flat 250c be positioned above the first flat 250a (see arrows). If the second flat 250c is positioned below the first flat 250a, the size of the chassis base 200 becomes larger than that of the display panel 100, which may not be good, but the present invention is not limited thereto. The first flat 250a and the second flat 250c are not necessarily parallel to each other. That is, the distance between the first flat 250a and the second flat 250c may become narrower or closer as much as they are spaced apart from the connecting portion 250b, but the present invention is not limited thereto. Moreover, the spaced distance between the first flat 250a and the second flat 250c may be defined variously under the conditions such as intrinsic properties, strength and structure of the chassis base 200 or the PDP 100.

On one side of the first flat 250a, i.e., where the second flat 250c is not arranged, the driving chip 453 is arranged as depicted in FIG. 2. The second flat 250c and the connecting portion 250b play a role of widening the area of heat radiation and, at the same time, reinforce the strength of the vertical section of the chassis base 200. Moreover, although a bending portion 251a between the chassis base 200 and the first flat 250a, a bending portion 251b between the first flat 250a and the connecting portion 250b, a bending portion 251c between the connecting portion 250b and the second flat 250c are depicted as right angle corners in FIG. 3, they may have curved surfaces through a rounding process.

Figure 4:
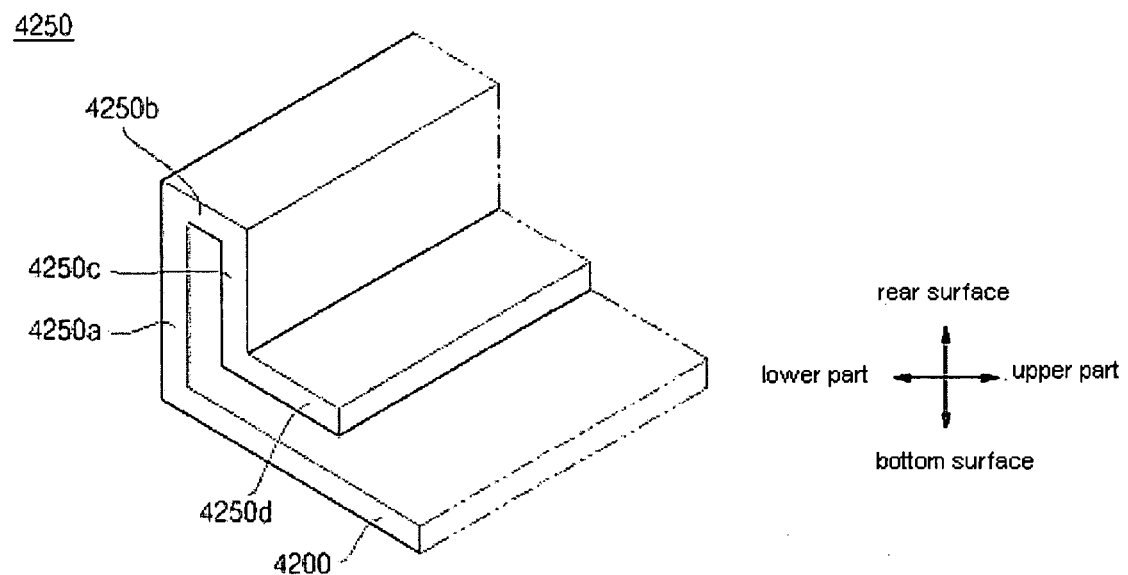
FIG. 4 is a partial perspective view of a structure of a reinforcing member in accordance with another embodiment of the present invention.

FIG. 4 is a partial perspective view of a second embodiment of the present invention, in which a reinforcing member further includes a third flat as compared with that of FIG. 3.

Referring to FIG. 4, a reinforcing member 4250 of a chassis base 4200 in accordance with the second embodiment of the present invention includes first to third flats 4250a, 4250c and 4250d, and a connecting portion 4250b. The structures of the first flat 4250a, the connecting portion 4250b and the second flat 4250c are the same as those of the first embodiment described in detail above with reference to FIG. 3.

A third flat 4250d is bent and extends from the second flat 4250c in the second embodiment. The third flat 4250d is spaced apart from the chassis base 4200 and parallel thereto. As described above, the spaced distance between the chassis base 4200 and the third flat 4250d may be set differently based on the intrinsic properties of the PDP or the chassis base 4200, but the present invention is not limited thereto.

Figure 5:
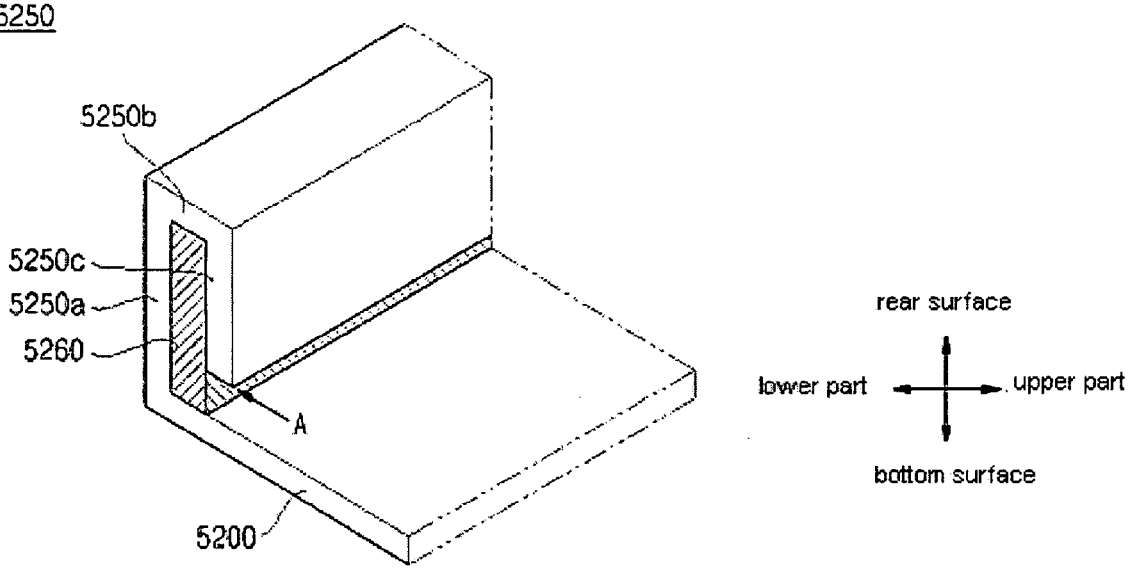
FIG. 5 is a partial perspective view of a structure in which a filling layer is added to the reinforcing member of FIG. 3.
Figure 6:
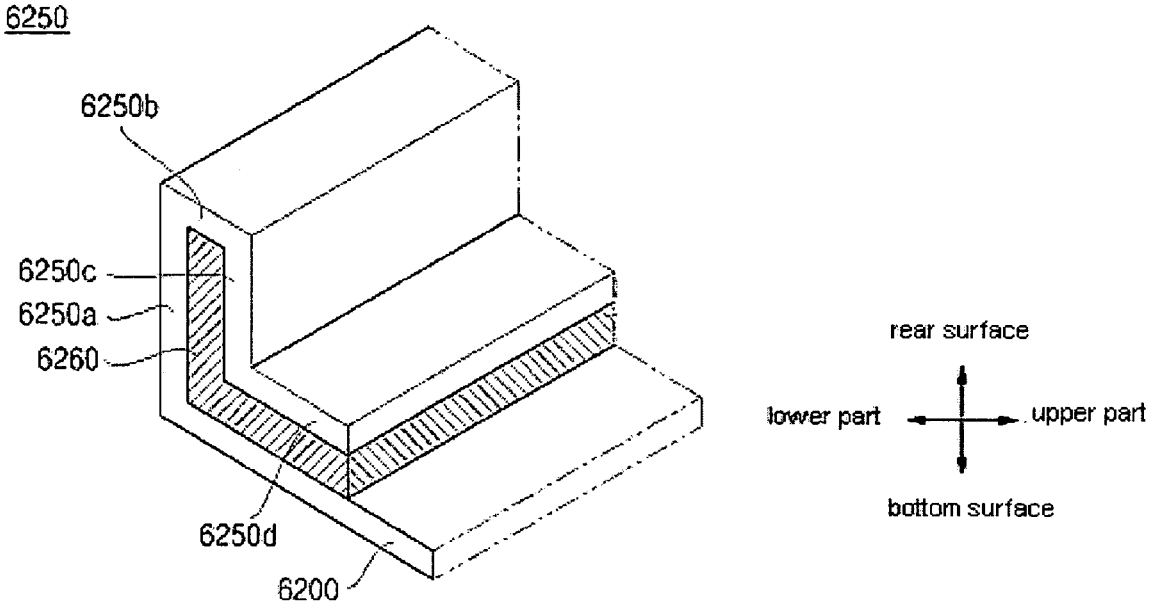
FIG. 6 is a partial perspective view of a structure in which a filling layer is added to the reinforcing member of FIG. 4.

FIG. 5 is a view of a third embodiment of the present invention, in which a filling layer is further arranged between the flats of the reinforcing member. Moreover, FIG. 5 depicts a case where the filling layer is formed on the reinforcing member of the first embodiment, and FIG. 6 depicts a case where the filling layer is established on the reinforcing member of the second embodiment.

In discussing FIG. 5, the description of the same elements as the first embodiment of FIG. 3 has been omitted and only the filling layer newly added thereto is described.

Referring to FIG. 5, a reinforcing member 5250 further includes a filling layer 5260 arranged between a first flat 5250a, a second flat 5250c, a connecting portion 5250b and a chassis base 5200.

The filling layer 5260 may be a material having excellent heat conductivity for improving the heat radiation performance of the reinforcing member 5250 or a reinforcing layer for reinforcing the strength of the reinforcing member 5250. The filling layer 5260 made of the material for improving the heat radiation efficiency may be any material selected from a group consisting of graphite, aluminum, copper, or a thin plate, tape, or wall fabricated using an equivalent thereof, or a heat conductive silicon gel, but the present invention is not limited thereto. Moreover, the material for reinforcing the strength of the reinforcing member 5250 may be any material selected from a group consisting of metal alloys, such as brass, bronze, aluminum, tin or an equivalent thereof, or a plastic or an equivalent thereof, but the present invention is not limited thereto. If a metal is used for reinforcing the strength and the metal or alloy having excellent heat conductivity is used, it is possible to expect the improvement of the heat conductivity and the increase of the strength as well.

Moreover, although FIG. 5 depicts the filling layer 5260 arranged from the connecting portion 5250b to the chassis base 5200, it is possible to establish the filling layer 5260 up to the boundary surface A of the second flat 5250c or only up to a position adjacent to the connecting portion 5250b.

Referring to FIG. 6, if a filling layer 6260 is provided on a reinforcing member 6250 of the second embodiment, the filling layer 6260 may be arranged between a first flat 6250a and a second flat 6250c as well as between a third flat 6250d and a chassis base 6200. However, the present invention is not limited thereto, and such a configuration may be selected in consideration of the manufacturing cost, the degree of design freedom, etc. Since it is possible to apply the description made with reference to FIG. 5 to properties and materials of the filling layer 6260, a detailed description of FIG. 6 has been omitted.

As described above, the PDP in accordance with the present invention can prevent an increase in the manufacturing cost due to the addition of reinforcing materials by establishing the reinforcing member on the chassis base.

Moreover, the PDP in accordance with the present invention can prevent damage due to the heat radiation of the TCP and further exclude a separate heat radiation supporting member by establishing the reinforcing member on the chassis base so as to support the heat radiation of the TCP.

Furthermore, the PDP in accordance with the present invention can maximize the heat radiation efficiency and the reinforcing performance by arranging the filling layer on the reinforcing member.

In addition, the PDP in accordance with the present invention can ensure the stable operation of the TCP by providing the protection plate for protecting the TCP so as to support the heat radiation of the TCP.

Exemplary embodiments of the present invention have been described and illustrated above. However, the present invention is not limited thereto. Rather, it should be understood that various modifications and variations of the present invention can be made thereto by those skilled in the art without departing from the spirit and scope of the present invention as defined by the appended claims.

What is claimed is:

1. A Plasma Display Panel (PDP) comprising:
   a display panel;
   a driving circuit to supply a driving signal to the display panel; and
   a chassis base, arranged between the driving circuit and the display panel, and including a reinforcing member having at least one bend and arranged on at least one side of edges of the chassis base, wherein the reinforcing member comprises a first flat extending from a surface of the chassis base in a direction perpendicular thereto, a second flat spaced apart from the first flat on the chassis base surface in a direction perpendicular to the chassis base surface, a connecting portion to connect the first flat to the second flat, a third flat extending from the second flat on the chassis base surface in a direction parallel to the chassis base surface, and a filling layer arranged between the first flat and the second flat and the filling layer arranged between the third flat and the chassis base surface.

2. The PDP as recited in claim 1, wherein the filling layer is at least one of graphite, aluminum, copper, or a thin plate or tape made of an alloy thereof, and a heat conductive silicon gel.

3. The PDP as recited in claim 2, wherein the driving circuit unit and the display panel are electrically connected together by a conductive connecting member including a Tape Carrier Package (TCP) having a driving chip arranged thereon.

4. The PDP as recited in claim 3, wherein the driving chip is arranged to contact the first flat.

5. The PDP as recited in claim 4, further comprising at least one of a heat conductor and an adhesion layer arranged between the driving chip and the first flat.

6. The PDP as recited in claim 5, further comprising a protection plate arranged on the reinforcing member of the chassis base and spaced apart from the connecting member.

7. The PDP as recited in claim 6, wherein the connecting member is arranged to contact the driving chip.

8. The PDP as recited in claim 7, further comprising at least one of a heat conductor and an adhesion layer arranged between the connecting member and the driving chip.

9. The PDP as recited in claim 8, further comprising an edge portion extending from at least one side of the edges of the chassis base having no reinforcing member arranged thereon in a direction perpendicular to the chassis base surface.

10. The PDP as recited in claim 9, further comprising at least one of an adhesion member and a heat conducting member arranged between the chassis base and the display panel.

* * * * *